(12) United States Patent
Kobayashi

(10) Patent No.: US 8,529,041 B2
(45) Date of Patent: Sep. 10, 2013

(54) METHOD OF MANUFACTURING LIQUID DISCHARGE HEAD AND LIQUID DISCHARGE HEAD

(75) Inventor: Yasunori Kobayashi, Gifu (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 646 days.

(21) Appl. No.: 12/749,490

(22) Filed: Mar. 29, 2010

(65) Prior Publication Data

US 2010/0245507 A1 Sep. 30, 2010

(30) Foreign Application Priority Data

Mar. 31, 2009 (JP) .................................. 2009-086137

(51) Int. Cl.
*B41J 2/175* (2006.01)

(52) U.S. Cl.
USPC .......................................................... 347/93

(58) Field of Classification Search
USPC ........ 347/68–72, 93, 89, 92, 95; 400/124.14, 400/124.16, 124.26; 29/25.35, 890.01, 890.09, 29/890.1
See application file for complete search history.

(56) References Cited

U.S. PATENT DOCUMENTS

| | | |
|---|---|---|
| 2002/0024567 A1 | 2/2002 | Takagi |
| 2008/0060198 A1 | 3/2008 | Nakashima |

FOREIGN PATENT DOCUMENTS

| | | |
|---|---|---|
| JP | H10-058680 A | 3/1998 |
| JP | 2002-059547 A | 2/2002 |
| JP | 2006-264140 A | 10/2006 |
| JP | 2008-062552 A | 3/2008 |

OTHER PUBLICATIONS

Japan Patent Office, Notice of Reasons for Rejection for Japanese Patent Application No. 2009-086137 (counterpart Japanese patent application), mailed Apr. 5, 2011.

*Primary Examiner* — Kristal Feggins
(74) *Attorney, Agent, or Firm* — Baker Botts L.L.P.

(57) ABSTRACT

In a method of manufacturing a liquid discharge head, the liquid discharge head has a flow-path unit having a liquid flow path, and a piezoelectric actuator unit. The liquid flow path has discharge openings and corresponding pressure chambers. The actuator unit has actuators which apply pressure to liquid in the pressure chambers. The method includes positioning the actuator unit to oppose the surface of the flow-path unit while extending on the plurality of pressure chambers, forming a particular film that is impermeable to the liquid on a supporting member. The particular film is secured to the surface of the flow-path unit by placing the supporting member on the flow-path unit, and aligning the supporting member such that a surface of the particular film opposes the surface of the flow-path unit while the openings of the plurality of pressure chambers are covered.

17 Claims, 11 Drawing Sheets

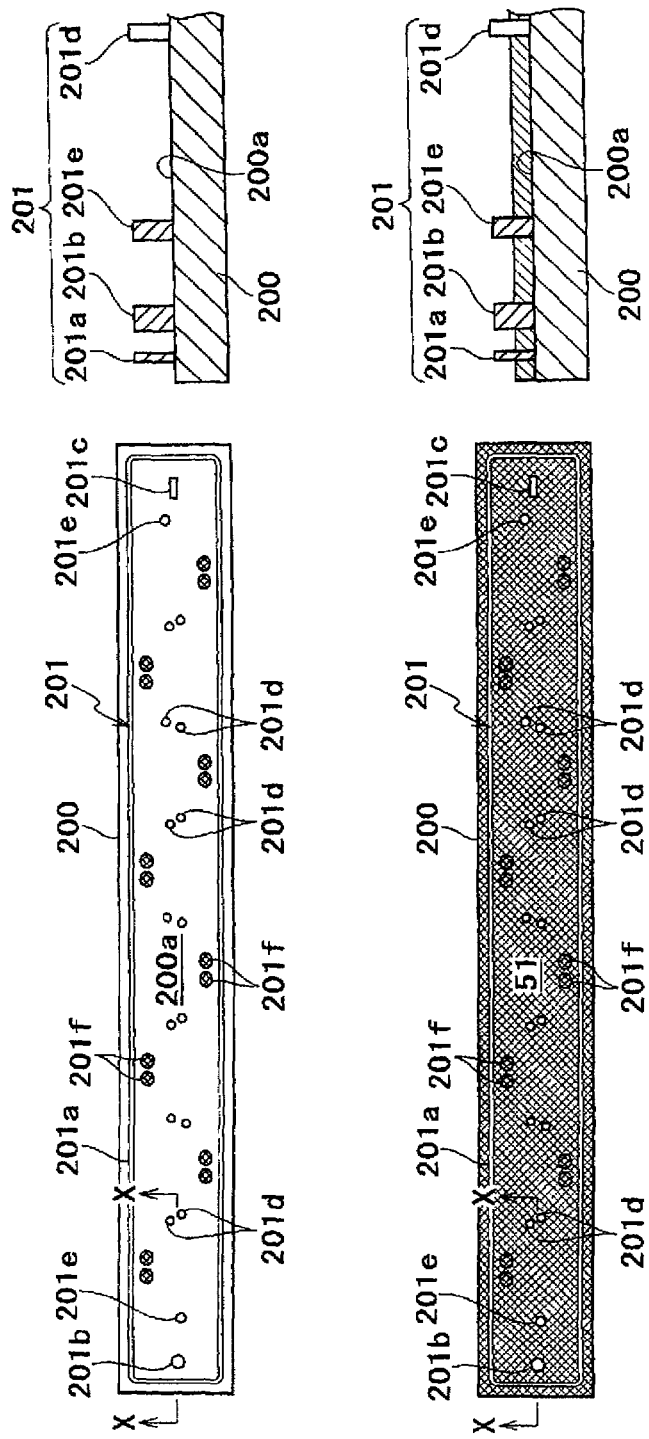

METHOD OF MANUFACTURING LIQUID DISCHARGE HEAD AND LIQUID DISCHARGE HEAD

CROSS REFERENCE TO RELATED APPLICATION

This application claims priority to Japanese Patent Application No. 2009-086137, filed on Mar. 31, 2009, the entire subject matter and disclosure of which is incorporated herein by reference.

BACKGROUND OF THE DISCLOSURE

1. Field of the Disclosure

The features herein relate to a method of manufacturing a liquid discharge head that discharges a liquid to a recording medium, and a liquid discharge head that discharges a liquid to a recording medium.

2. Description of the Related Art

A known ink jet head includes a flow-path unit and a piezoelectric actuator unit. The flow-path unit includes an ink flow path including a plurality of discharge openings and a plurality of pressure chambers corresponding to the respective discharge openings. The plurality of pressure chambers open at a surface of the flow-path unit. The actuator unit is positioned on the surface of the flow-path unit, and extends on the plurality of pressure chambers. The actuator unit includes a plurality of actuators that apply pressure to ink in the pressure chambers. The actuators are positioned in correspondence with the pressure chambers. In such a structure, since a piezoelectric sheet of the actuator unit covers the openings of the pressure chambers, the ink in the pressure chambers contacts the piezoelectric sheet. Therefore, if the piezoelectric sheet is damaged, e.g., there is a very small crack in the piezoelectric sheet, the ink in the pressure chambers may flow into the crack and may penetrate the piezoelectric sheet. As a result, an electrical short circuit may occur between electrodes of the actuator unit.

SUMMARY OF THE DISCLOSURE

Therefore, a proposal is made to interpose an adhesive sheet (formed of, for example, synthetic resin) between the flow-path unit and the actuator unit to prevent the piezoelectric sheet from directly contacting the ink in the pressure chambers.

A need has arisen for a method of manufacturing a liquid discharge head allowing forming a thin and smooth member which is interposed between a flow-path unit and an actuator unit. Also, a need has arisen for a liquid discharge head comprising the thin and smooth member which is interposed between the flow-path unit and the actuator unit.

According an embodiment of the invention, in a method of manufacturing a liquid discharge head, the liquid discharge head comprises a flow-path unit and a piezoelectric actuator unit, the flow-path unit comprising a liquid flow path comprising a plurality of discharge openings and a plurality of pressure chambers which open at a surface of the flow-path unit and correspond to the plurality of discharge openings, the actuator unit comprising a plurality of actuators which apply pressure to liquid in the pressure chambers. The method comprises the steps of positioning the actuator unit to oppose the surface of the flow-path unit while extending on the plurality of pressure chambers, forming a particular film on a surface of a supporting member that supports the particular film such that a pattern which includes areas of the surface of the flow-path unit corresponding to openings of the plurality of pressure chambers is formed, wherein the particular film is impermeable relative to the liquid, and securing the particular film to the surface of the flow-path unit. The securing step comprises the steps of placing the supporting member having the particular film formed thereon on the flow-path unit, and aligning the supporting member such that a surface of the particular film on a side opposite to the supporting member opposes the surface of the flow-path unit while the openings of the plurality of pressure chambers are covered.

According to another embodiment of the invention, a liquid discharge head comprises a flow-path unit comprising a liquid flow path, the liquid flow path comprising a plurality of discharge openings, and a plurality of pressure chambers which are configured to correspond to the plurality of discharge openings, a piezoelectric actuator unit, the piezoelectric actuator unit comprising a plurality of actuators which are configured to apply pressure to liquid in the pressure chambers, wherein the piezoelectric actuator unit is positioned to oppose the surface of the flow-path unit while extending on the plurality of pressure chambers, and a particular film which is positioned between the flow-path unit and the actuator unit and configured to be impermeable with respect to the liquid, wherein the particular film has a thickness of from 5 to 20 µm.

Other objects, features, and advantages of embodiments of the present invention will be apparent to persons of ordinary skill in the art from the following description of embodiments with reference to the accompanying drawings.

BRIEF DESCRIPTION OF THE DRAWINGS

Embodiments of a method of manufacturing a liquid discharge head, and a liquid discharge head, are described with reference to the accompanying drawings, which are given by way of example only, and are not intended to limit the present application.

FIG. 7A is a plan view for illustrating the step of forming a protective film in the method of manufacturing the inkjet head, and a partial sectional view along line X-X in the plan view showing the step of forming a resist, according to an embodiment of the invention.

FIG. 7B is a plan view for illustrating the step of forming a protective film in the method of manufacturing the inkjet head, and a partial sectional view along line X-X in the plan view showing a state in the step of forming a nickel film, according to an embodiment of the invention.

DETAILED DESCRIPTION OF THE EMBODIMENTS

Various embodiments, and their features and advantages, may be understood by referring to FIGS. 1-11, like numerals being used for corresponding parts in the various drawings.

Figure 1:
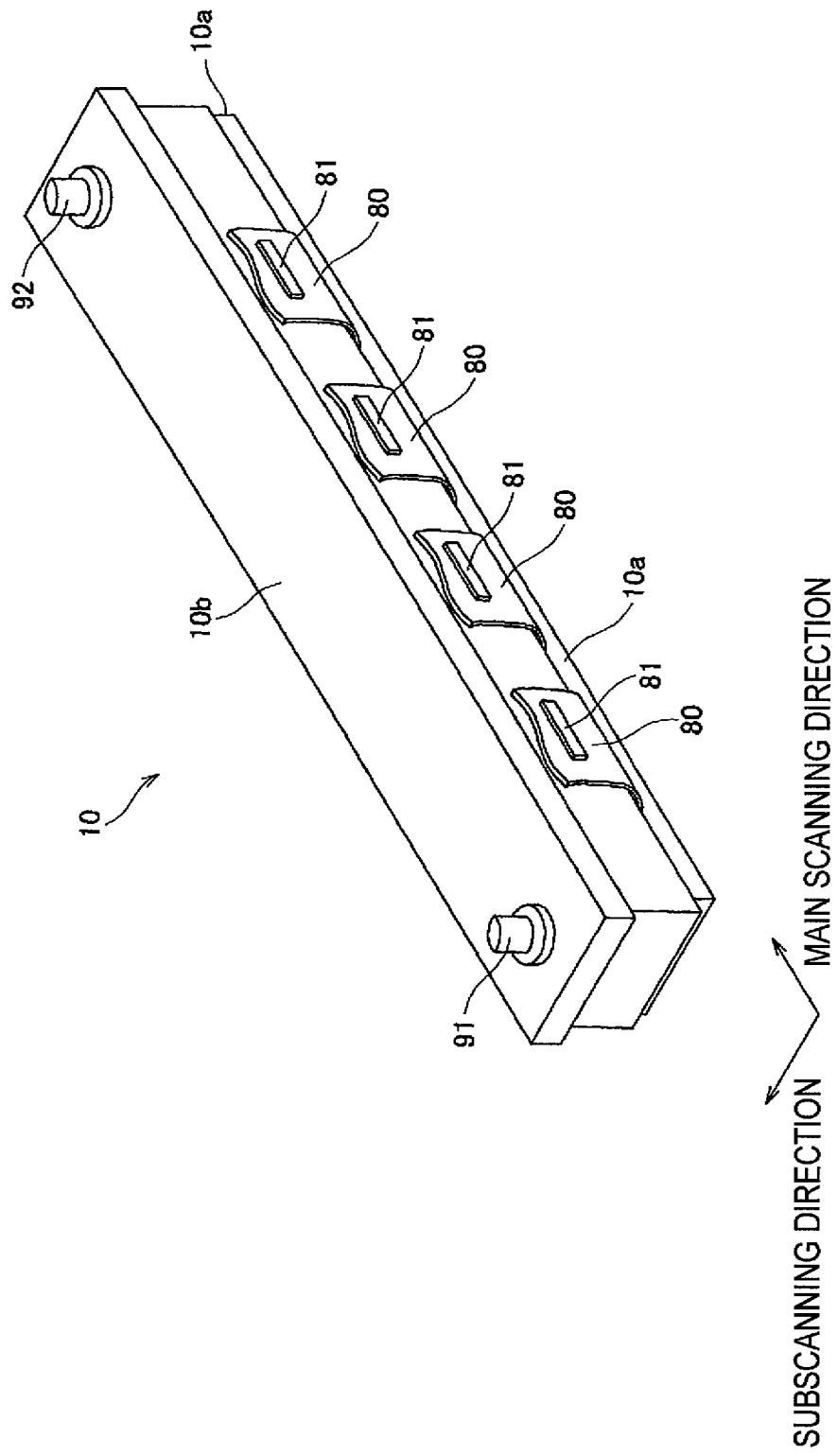
FIG. 1 is a perspective view of an inkjet head manufactured by a manufacturing method according to an embodiment of the invention.

In an embodiment of the invention, as shown in FIG. 1, the inkjet head 10 manufactured by a manufacturing method may have as a whole a substantially rectangular parallelepiped shape that is elongated in one direction. The inkjet head 10 may be positioned in a device such that the longitudinal direction of the inkjet head is parallel to a main scanning direction. The inkjet head 19 may perform recording on a recording medium conveyed in a secured state in an apparatus such as a printer. A plurality of, e.g., four, heads 10 that discharge ink of different colors (e.g., magenta, cyan, yellow, black), respectively, may be positioned side by side along a subscanning direction.

Figure 2:
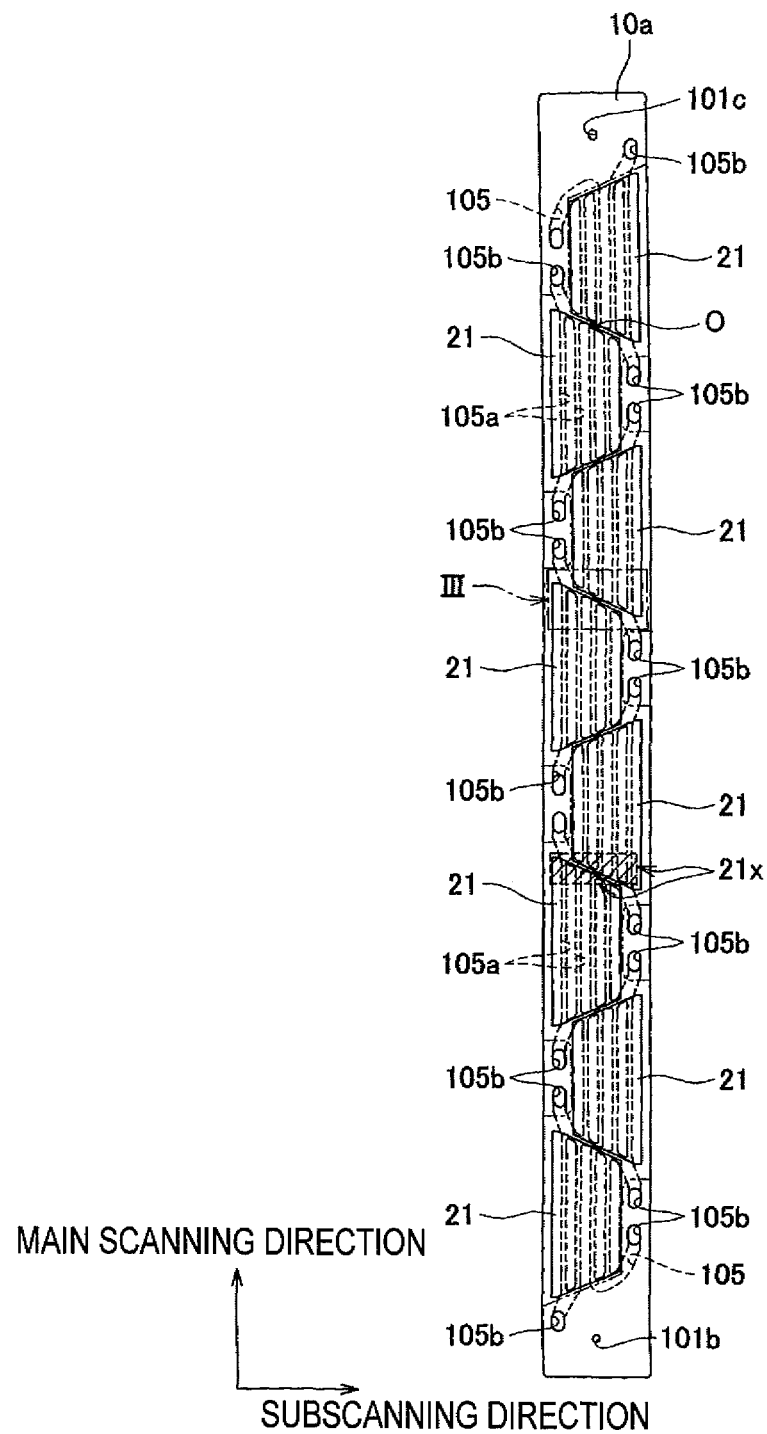
FIG. 2 is a plan view of a flow-path unit of the inkjet head, according to an embodiment of the invention.

The head 10 may include a flow-path unit 10a, trapezoidal-shaped actuator units 21, e.g., as shown in FIG. 2, and a reservoir unit 10b, in that order from the lower side. The actuator units 21 may be positioned on the upper surface of the flow-path unit 10a. The reservoir unit 10b may be secured above the flow-path unit 10a to areas where the actuator units 21 are not positioned, e.g., areas including openings 105b, which are marked by two-dot chain lines in FIG. 2. The reservoir unit 10b may oppose the actuator units 21 with slight gaps formed therebetween. The actuator units 21 may be interposed between the flow-path unit 10a and the reservoir unit 10b in a vertical direction.

Excluding positioning holes 101b, 101c, 101d, and 101e, shown and explained in more detail with reference to FIG. 9A, the entire area, including where the actuator units 21 are positioned, of the upper surface of the flow-path unit 10a may be covered with a protective film 50, shown and explained in more detail with reference to FIG. 5A. The protective film 50 may comprise one or more of a nickel film 51 and a noble-metal film 52. The actuator units 21 may be secured to the upper surface of the flow-path unit 10a through the protective film 50 instead of being directly secured to the upper surface of the flow-path unit 10a. Mesh filters 50f, e.g., as shown in FIGS. 9A and 10B, may be positioned at portions of the protective film 50 corresponding to the openings 105b of the flow-path unit 10a.

Figure 9A:
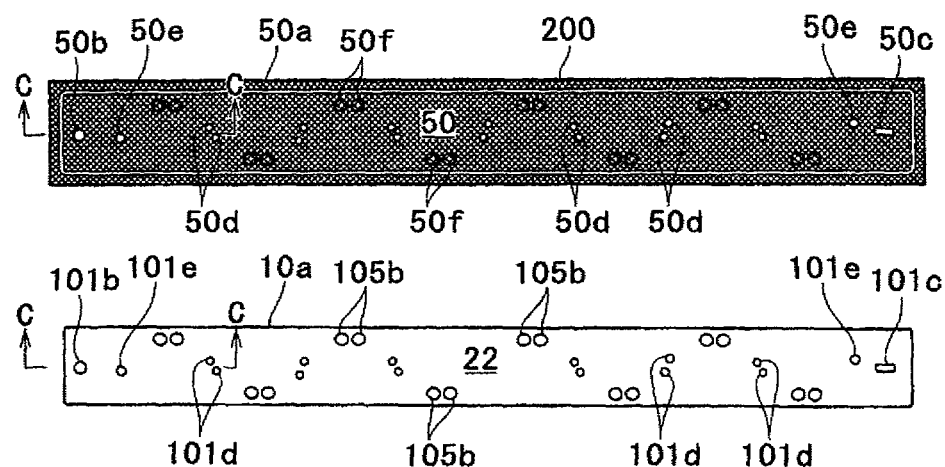
FIG. 9A is a plan view of the upper surface of a silicon wafer and the upper surface of a flow-path unit prior to securing the protective film, for illustrating the step of securing the protective film in the method of manufacturing the inkjet head, according to an embodiment of the invention.
Figure 9B:
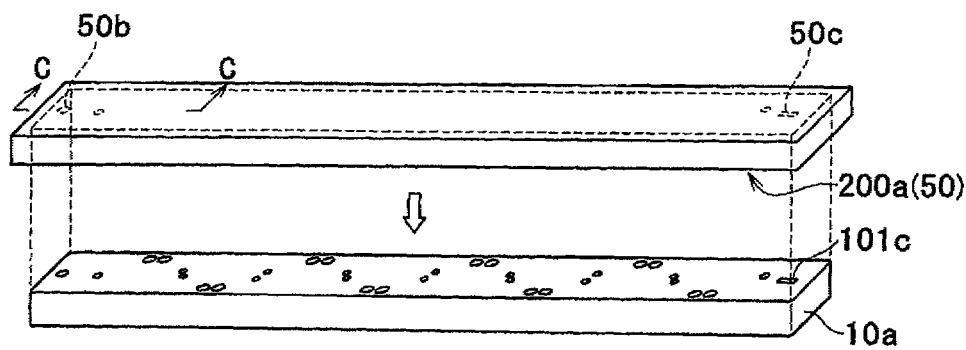
FIG. 9B is a perspective view showing a state in which the silicon wafer is aligned prior to placing it on the upper surface of the flow-path unit, for illustrating the step of securing the protective film in the method of manufacturing the inkjet head, according to an embodiment of the invention.
Figure 10A:
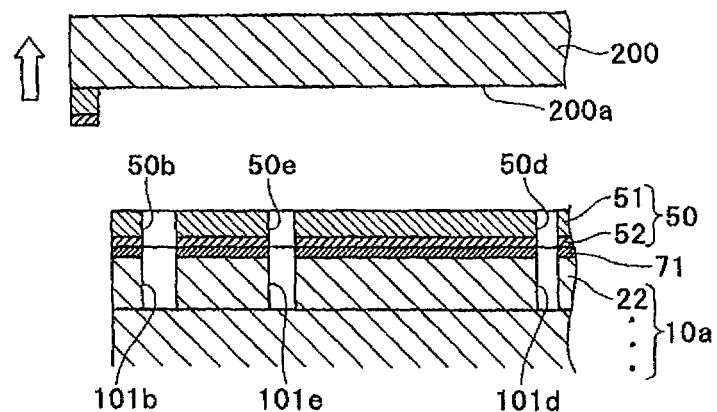
FIG. 10A is a partial sectional view along line A-A in FIG. 10B and showing a state in which the silicon wafer is separated.
Figure 10B:
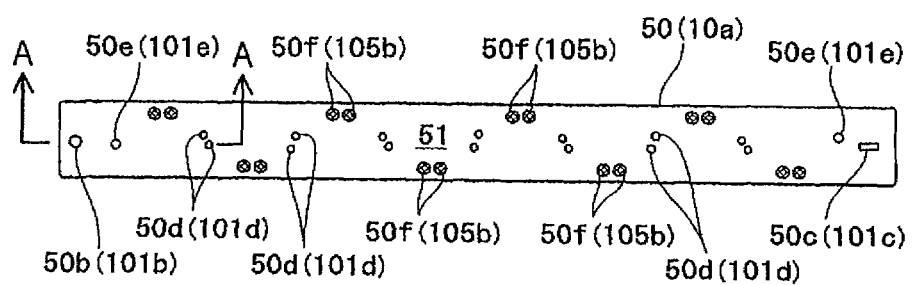
FIG. 10B is a plan view showing the upper surface of the flow-path unit including the protective film formed thereon after separating the silicon wafer, according to an embodiment of the invention.

Referring to FIG. 1, the reservoir unit 10b may be a flow-path member that supplies temporarily stored ink from the openings 105b, shown in FIG. 2, into the flow-path unit 10a through the filters 50f, shown in FIGS. 9A and 10B, of the protective film 50. The temporarily stored ink may be supplied from an ink supply source, e.g., a main tank, through a joint 91 provided near one end of the upper surface of the reservoir unit 10b in the main scanning direction. A joint 92 provided near the other end of the upper surface of the reservoir unit 10b in the subscanning direction may be configured such that the ink in the reservoir unit 10b is discharged to the outside through the joint 92 during maintenance such as purging.

Figure 3:
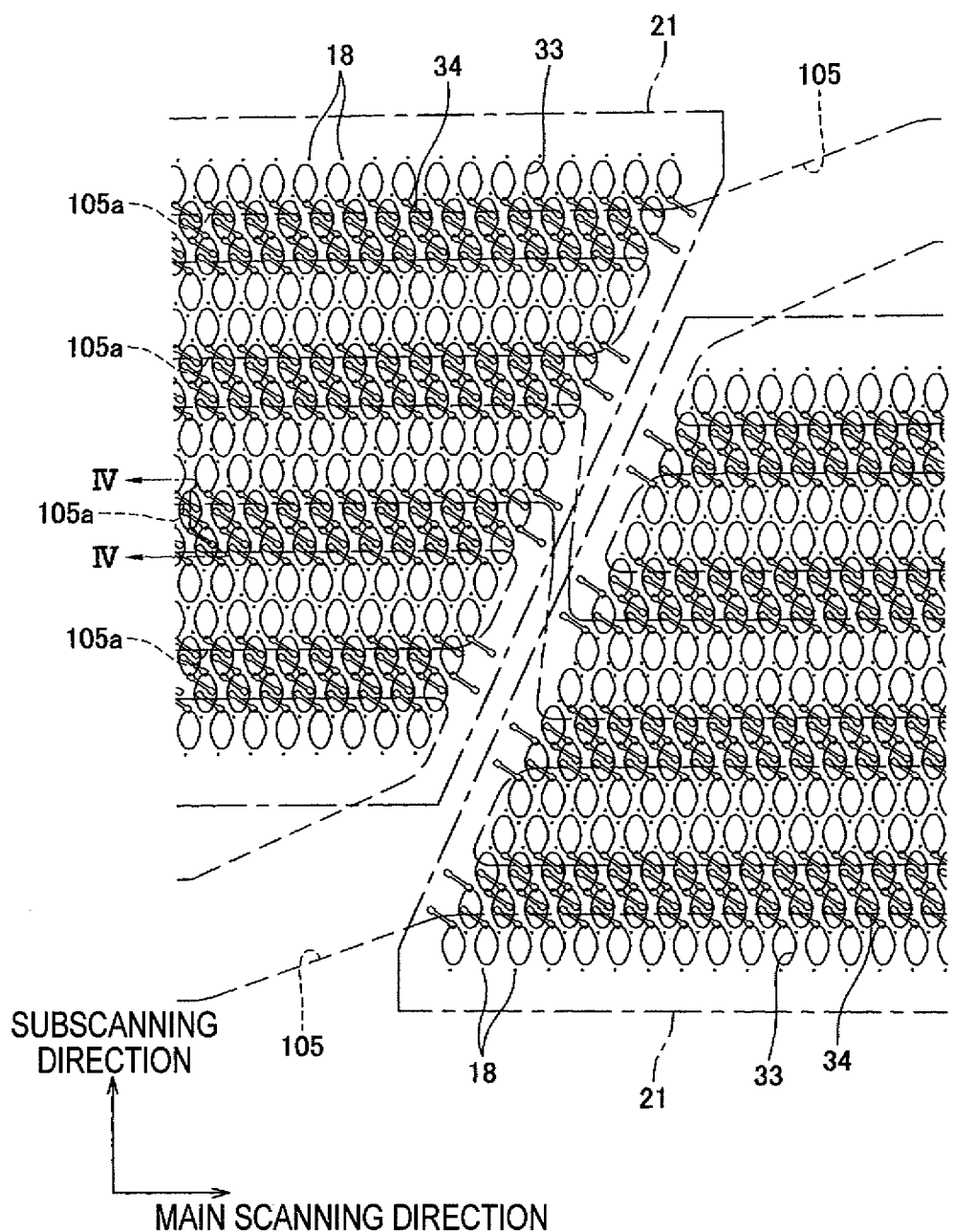
FIG. 3 is an enlarged view of an area III surrounded by an alternate long and short dash line in FIG. 2.
Figure 4:
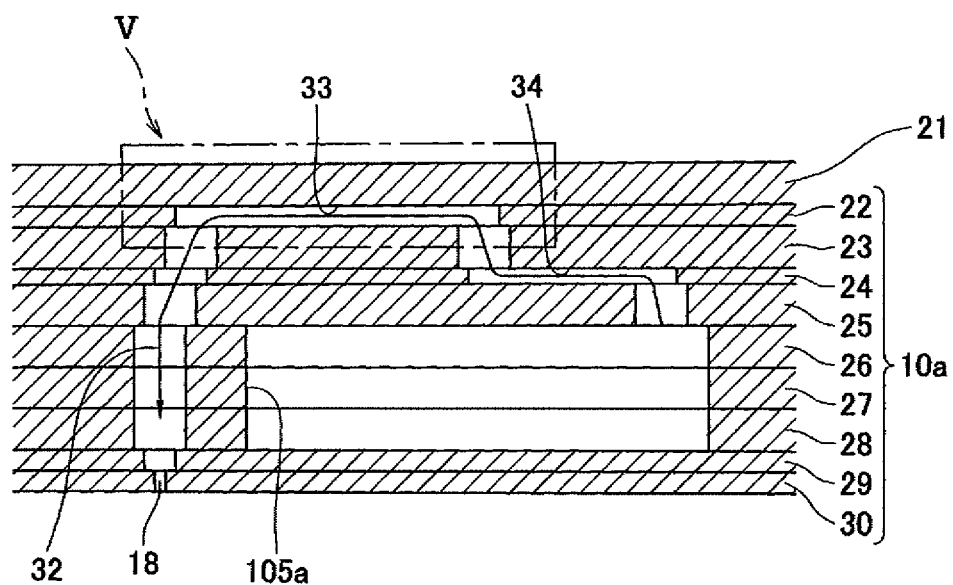
FIG. 4 is a sectional view along line IV-IV in FIG. 3.

Referring to FIGS. 2 to 4, the flow-path unit 10a may be a flow-path member that may distribute ink supplied from the openings 105b, which may be formed, for example, in the upper surface of the flow-path unit 10a, to a plurality of discharge openings 18, which may be formed, for example, in the lower surface of the flow-path unit 10a. The flow path member may distribute ink through a common ink path, e.g., a manifold flow path 105 and a sub-manifold flow path 105a, and through individual ink flow paths 32 formed in the flow-path unit 10a.

When viewed in a plan view, the flow-path unit 10a and the reservoir unit 10b may be elongated in the main scanning direction. The flow-path unit 10a and the reservoir unit 10b may have a substantially rectangular shape, and may have substantially the same size. Referring to FIG. 4, the flow-path unit 10a may be a stacked member configured by stacking and securing a plurality of, e.g., nine, metallic plates 22, 23, 24, 25, 26, 27, 28, 29, and 30 that are aligned with each other. The plurality of, e.g., nine, metallic plates 22 to 30 may have a substantially rectangular shape, and may have substantially the same size. Through holes that may form the ink flow paths, e.g., the common ink path, may be formed in the respective metal plates 22 to 30.

Although not shown, the reservoir unit 10b may be a stacked member including an upper reservoir and a lower reservoir. The upper reservoir may be integrally formed, and may comprise a resin. The lower reservoir may be configured by stacking and securing a plurality of metal plates that are aligned with respect to each other. The ink reservoirs and an ink flow path may be positioned in the reservoir unit 10b.

Referring to FIGS. 3 and 4, the discharge openings 18 may be formed in a matrix in trapezoidal areas corresponding to where the actuator units 21 are positioned in the lower surface, e.g., the ink discharge surface, of the flow-path unit 10a. A plurality of pressure chambers 33 corresponding to the respective discharge openings 18 may open in a matrix at the disposition areas of the actuator units 21 at the upper surface of the flow-path unit 10a. In plan view, the pressure chambers 33 may have a substantially rhombic shape.

Referring to FIG. 2, in addition to the pressure chambers 33, 18 openings 105b may be formed in the upper surface of the flow-path unit 10a, so as to avoid the areas where the plurality of, e.g., eight, actuator units 21 are formed. The manifold flow path 105, the sub-manifold flow path 105a, and the plurality of individual ink flow paths 32, e.g., as shown in FIG. 4, may be formed in the interior of the flow-path unit 10a. The manifold flow path 105 may be in fluid communication with the openings 105b. The sub-manifold flow path 105a may be branched from the manifold flow path 105 and may extend along the main scanning direction. The individual ink flow paths 32 may be branched from the sub-manifold flow path 105a. The individual ink flow paths 32 may be flow paths that are positioned for the respective discharge openings 18, and extend from the exit of the sub-manifold flow path 105a to the discharge openings 18 through an aperture 34 that functions as a restriction mechanism, and the pressure chambers 33.

As shown in FIG. 3, the actuator units 21 that may be positioned on the flow-path unit 10a are indicated by short and long dashed lines, and the aperture 34 and the discharge openings 18, e.g., which may be formed in the interior and the lower surface of the flow path unit 10a, respectively, that ordinarily would be indicated by broken lines, are instead indicated by solid lines, in order to clarify the flow-path structure.

Referring to FIG. 2, a plurality of, e.g., eight, actuator units 21 may have the same shape and size. The plurality of actuator units 21 may be positioned adjacent to each other along the main scanning direction which corresponds to a longitudinal direction of the flow-path unit 10a, at the upper surface of the flow-path unit 10a. The actuator units 21 that are adjacent to each other may be arranged such that their upper bases and their lower bases are oriented in opposite directions in the sub-scanning direction. In addition, the actuator units 21 that are adjacent to each other may be positioned to be shifted from each other. That is, the lower bases may be positioned close to the respective end portions of the flow-path unit 10a in the subscanning direction, and the distance between the lower base sides and the respective end portions of the flow-path unit 10a in the subscanning direction may be less than the distance between the upper base sides and the respective end portions of the flow-path unit 10a in the subscanning direction.

Two adjacent actuator units 21 may be positioned such that their respective oblique sides are parallel and close to each other, and may partially overlap each other in the subscanning direction and the main scanning direction at a substantially triangular area 21x, including an acute-angled area formed by the oblique sides and the lower bases. The two adjacent actuator units 21 may be symmetrically positioned about a point, with respect to the center of an area including the two adjacent actuator units 21 at the upper surface of the flow-path unit 10a. In an embodiment of the invention, as shown in FIG. 2, two adjacent actuator units 21 may by point-symmetrically positioned about a point passing through the center in the axial direction of the flow-path unit 10a between the opposing oblique sides of the two actuator units 21, e.g., a center O positioned at the two upper actuator units 21 as shown in FIG. 2. The actuator units 21 may include a plurality of piezoelectric actuators which extend on both sides of the plurality of chambers 33 and which apply pressure to ink in the respective pressure chambers 33.

Figure 5A:
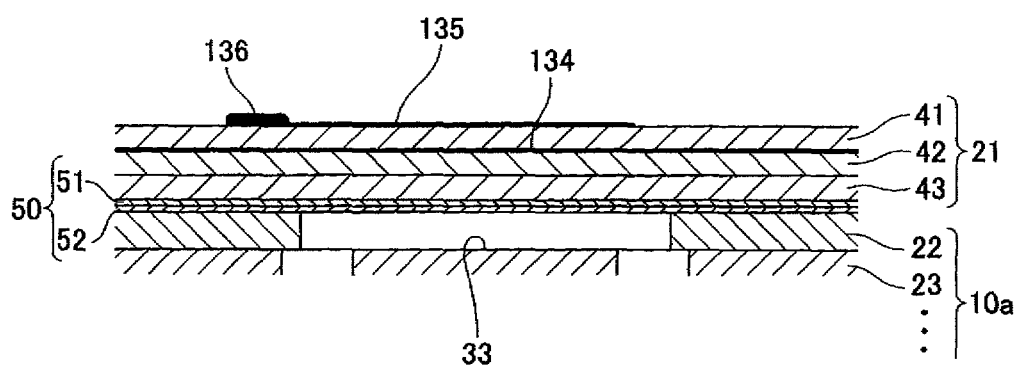
FIG. 5A is an enlarged view of an area V shown in FIG. 4.

Referring to FIG. 5A, the actuator unit 21 may include a plurality of, e.g., three, piezoelectric ceramic layers 41, 42, and 43, that may be stacked upon each other. The actuator unit 21 may also include individual electrodes 135 that are positioned in correspondence with the respective pressure chambers 33 at the upper surface of the topmost piezoelectric ceramic layer 41. The actuator unit 21 may further comprise individual lands 136 electrically connected to the individual electrodes 135. The actuator unit 21 also may comprise an internal common electrode 134 that is positioned along the entire surface between the piezoelectric ceramic layer 41 and the piezoelectric ceramic layer 42 therebelow. There may be no electrodes positioned between the piezoelectric ceramic layer 42 and the piezoelectric ceramic layer 43.

In an embodiment of the invention, the piezoelectric ceramic layers 41 to 43 may comprise a ceramic material that is strongly ferroelectric, e.g., a lead zirconate titanate ("PZT"). In an embodiment of the invention, each of the piezoelectric layers 41 to 43 may have a thickness of about 15 µm. A common electrode land may be also positioned on the surface of the piezoelectric ceramic layer 41, and may be in electrical conduction with the internal common electrode 134 through a through hole. The common electrode land may have a substantially similar size and shape as the individual lands 136. An active portion interposed between the internal common electrode 134 and each individual electrode 135 at the piezoelectric ceramic layer 41 may function as an actuator that applies pressure to the ink in each of the pressure chambers 33.

An end of a flexible printed circuit board ("FPC") 80, e.g., as shown in FIG. 1, may be connected to the common electrode land and the individual land 136 of each actuator unit 21. Each FPC 80 may be led out upwardly from between the flow-path unit 10a and the reservoir unit 10b, and the other end thereof may be connected to a control substrate (not shown). A driver IC 81 may be mounted to a portion of each FPC 80. Each FPC 80 may transmit an image signal output from the control substrate to the corresponding driver IC 81, and may supply a driving voltage output from the corresponding driver IC 81 to the corresponding actuator unit 21. Referring to FIG. 1, one driver IC 81 may be provided for each FPC 80.

Ink supplied from the reservoir unit 10b to the interior of the flow-path unit 10a through the openings 105b may flow into each of the individual ink flow paths 32 through the common ink path. At this time, as shown in FIGS. 9A and 10B, foreign matter included in the ink may be removed by the filters 50f of the protective film 50 positioned at the openings 105b. In addition, when the actuators of the actuator units 21 are driven in accordance with the driving voltages from the driver ICs 81, pressure may be applied to the ink in the pressure chambers 33 due to changes in the volumes of the pressure chambers 33, such that the ink is discharged from the respective discharge openings 18.

Figure 6:
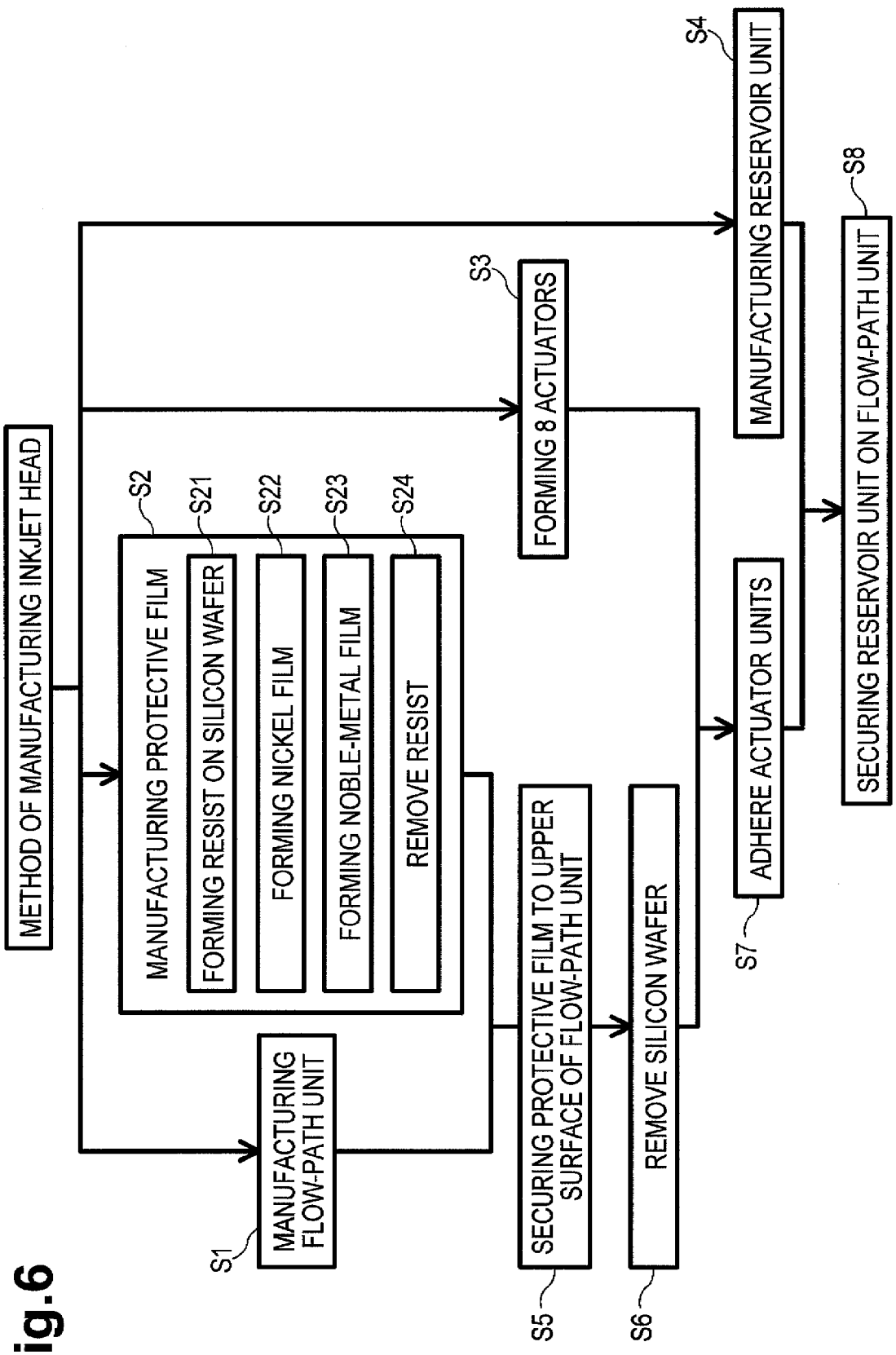
FIG. 6 shows the steps of manufacturing the inkjet head, according to an embodiment of the invention.

Referring to FIG. 6, a flow-path unit 10a, a protective film 50, a plurality of, e.g., eight, actuator units 21, and a reservoir unit 10b may be separately manufactured and then may be mounted to each other to manufacture the head 10. At Step S1, the manufacturing process comprises manufacturing the flow-path unit. At Step S2, the manufacturing process comprises manufacturing the protective film. At Step S3, the manufacturing process comprises manufacturing the actuator unit. At Step S4, the manufacturing process comprises manufacturing the reservoir unit. Each of Steps S1 through S4 may be performed independently of each other. Any of these steps may be performed first, or may be concurrently performed.

At Step S1, e.g., the step of manufacturing the flow-path unit, first, holes may be formed by etching metallic plates, such as a plurality of, e.g., nine, stainless steel plates, using photolithography, to manufacture plates 22 to 30, as shown in FIG. 4. Thereafter, the plates 22 to 30 may be stacked upon each other using an adhesive and pressed while heating them such that ink flow paths, such as individual ink flow paths 32, may be formed. By this, the adhesive may be hardened, and the plates 22 to 30 may be attached to each other, such that the flow-path unit 10a may be completed. At this time, a thermosetting epoxy adhesive may be used as the adhesive.

At Step S3, e.g., the step of manufacturing the actuator units, a plurality of, e.g., three, green sheets, which become piezoelectric ceramic layers 41 to 43, e.g., as shown in FIG. 5A, may be prepared for each actuator unit 21. Then, screen-printing of, for example, Ag—Pd conductive pastes may be performed on the green sheet that becomes the piezoelectric ceramic layer 41 using a pattern of individual electrodes 135 and on the green sheet that becomes the piezoelectric ceramic layer 42 using a pattern of an internal common electrode 134. Thereafter, while positioning the green sheets with a jig, the green sheet that becomes the piezoelectric ceramic layer 42 may be placed upon the green sheet that is not subjected to printing and that becomes the piezoelectric ceramic layer 43, after that the green sheet that becomes the piezoelectric ceramic layer 41 may be placed upon the green sheet that becomes the piezoelectric ceramic layer 42.

In an embodiment of the invention, the green sheets may be stacked upon each other such that electrode print surfaces are interposed between the green sheets. The stacked body of green sheets may be degreased as with a related ceramic, and may be baked to a predetermined temperature. Then, printing of an AU conductive paste, which may comprise glass frit and may become individual lands 136, may be performed on an extending portion of each individual electrode 135. At this time, printing of a common electrode land may be also similarly performed. Thus, the actuator units 21 may be completed according to an embodiment of the invention.

At Step S4, the step of manufacturing the reservoir unit, first, an upper reservoir may be manufactured by integrally molding a material such as resin. In addition, a lower reservoir may be manufactured by stacking and securing a plurality of metallic plates (including through holes forming flow paths) that are aligned with respect to each other. The reservoir unit 10b may be completed by mounting the upper and lower reservoirs to each other.

At Step S2, the step of manufacturing the protective film, first, a substantially rectangular, plate-like silicon wafer 200 having a size that is one size larger than that of the flow-path unit 10a in plan view may be provided. Then, referring to FIG. 7A, a resist 201 may be formed at Step S21 by performing exposure and development on an upper surface 200a of the silicon wafer 200 through, for example, a patterned photoresist. Thereafter, referring to FIG. 7B, using a method, e.g., a nickel electroforming method, a nickel film 51 may be formed on a portion of the upper surface 200a of the silicon wafer 200 where the resist 201 is not formed (Step S22). The nickel film 51 may be a thin film that is impervious, e.g., impermeable, to ink.

Here, the upper surface 200a of the silicon wafer 200, e.g., the surface of the silicon wafer 200 where the resist 201 and the nickel film 51 are formed, may be a smooth surface polished into a mirror surface. Thus, the upper surface 200a may have a surface roughness that is less than or equal to Rz=0.1 μm, e.g., the roughness parameter Rz has a value of less than or equal to 0.1.

The resist 201 may comprise an outer frame portion 201a, positioning portions 201b, 201c, 201d, and 201e, and filter portions 201f. The outer frame portion 201a may be a resist portion formed into an annular shape along the outer periphery of the silicon wafer 200 at a predetermined distance from the outer peripheral edges of the silicon wafer 200 in such a way as to correspond to the outer peripheral edges of the upper surface of the flow-path unit 10a. The positioning portions 201b and 201c may be resist portions corresponding to the positioning holes 101b and 101c, e.g., as shown in FIG. 2, formed near respective ends in the longitudinal direction of the upper surface of the flow-path unit 10a. The positioning portions 201b and 201c may be larger than their respective positioning holes 101b and 101b in plan view. The positioning portions 201d may be resist portions corresponding to the positioning holes 101d, as shown in FIG. 9A, formed in the upper surface of the flow-path unit 10a.

The positioning portions 201d may be formed such that a plurality of, e.g., two, each are formed along the gap between the oblique sides of the actuator units 21 that are positioned adjacent to each other on the upper surface of the flow-path unit 10a. The positioning portions 201e may be resist portions corresponding to the positioning holes 101e, as shown in FIG. 9A, formed in the upper surface of the flow-path unit 10a. The positioning portions 201e may be formed in correspondence with the oblique sides of the outer sides in the main scanning direction of the actuator units 21 that are positioned near the respective ends in the main scanning direction of the upper surface of the flow-path unit 10a. The filter portions 201f may be resist portions formed in a mesh at the positions corresponding to the openings 105b, as shown in FIG. 2, in the upper surface of the flow-path unit 10a.

The step of forming the nickel film, e.g., Step S22, may be performed using, for example, a sulfamate bath, e.g., which may comprise, in an embodiment of the invention, one 450 to 600 g/l of nickel sulfamate, 30 to 45 g/l boric acid, and 5 to 10 g/l of nickel chloride. In an embodiment of the invention, the sulfamate bath may have a liquid temperature of 40 to 60° C., and cathode current density of 0.5 to 10 A/dm$^2$.

Because the resist 201 may not be formed at the portions corresponding to where the actuator units 21 are positioned, the nickel film 51 may be formed using a pattern including areas corresponding to the openings of the pressure chambers 33 at the upper surface of the flow-path unit 10a. Moreover, because the nickel film 51 may be formed along substantially the entire silicon wafer 200, which is larger than the flow-path unit 10a in plan view, the area of the silicon wafer 200 occupied by the nickel film 51 may be greater than the area of the upper surface of the flow-path unit 10a.

In an embodiment of the invention, the nickel film 51 may be formed with an annular shape at an area that is situated outwardly of the outer frame portion 201a. This area may be a portion where electrical current concentrates during the nickel electroforming method in Step S22. Thus, the growth of the nickel at this area may be faster than that at other areas. As a result of which, the nickel film 51 may tend to be thick. In contrast, in an area that is situated inwardly of the outer frame portion 201a, regardless of the location, inflowing electrical current may be constant, such that the growth of the nickel is constant, as a result of which the thickness of the nickel film 51 may tend to be uniform. Accordingly, the outer frame portion 201a may be also a boundary between the area where the thickness of the nickel film 51 is not uniform and the area where the thickness of the nickel film 51 is uniform.

Figures 8A, 8B:
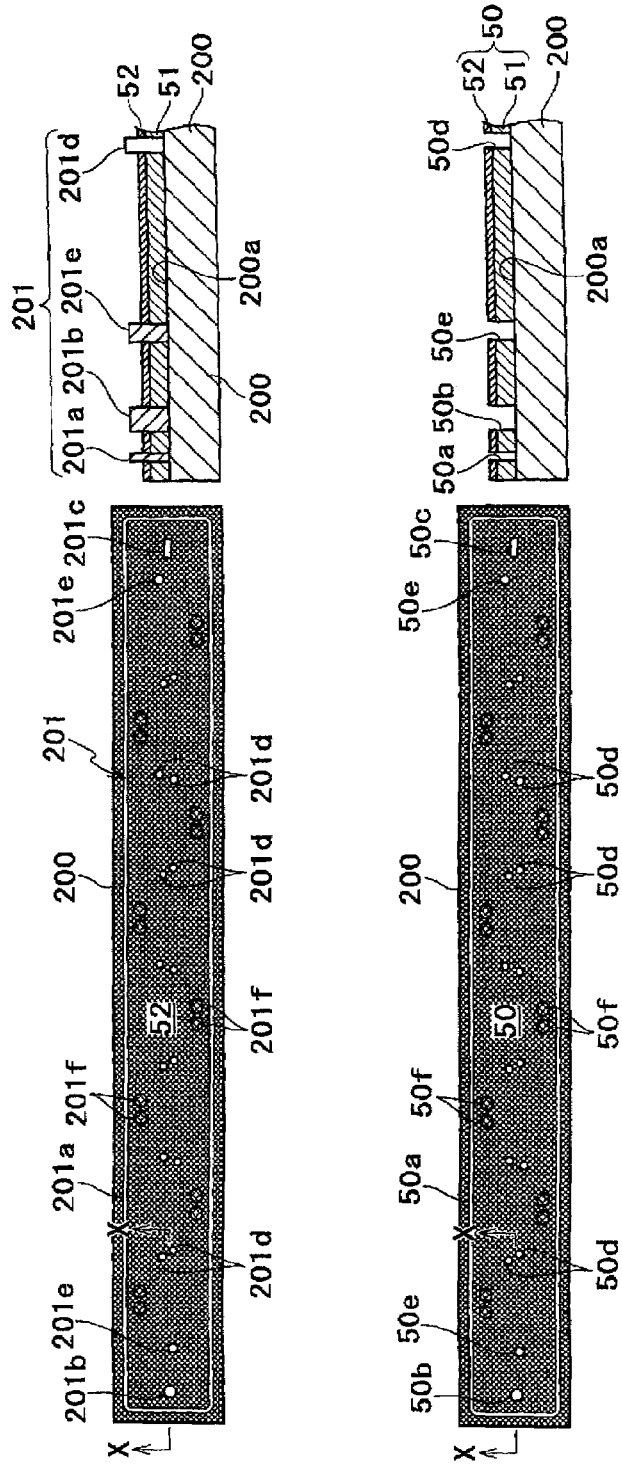
FIG. 8A is a plan view for illustrating the step of forming the protective film in the method of manufacturing the inkjet head and a partial sectional view along line X-X in the plan view showing the step of forming a noble-metal film, according to an embodiment of the invention.
FIG. 8B is a plan view for illustrating the step of forming the protective film in the method of manufacturing the inkjet head and a partial sectional view along line X-X in the plan view showing a state in the step of removing the resist, according to an embodiment of the invention.

After the step of forming the nickel film, e.g., Step S22, as shown in FIG. 8A, a noble-metal film 52 may be formed on the nickel film 51 at Step S23. The noble-metal film 52 may be formed over the entire surface of the nickel film 51, e.g., the surface of the nickel film 51 at a side opposite to the silicon wafer 200. The material of the noble-metal film 52 may be, for example, gold (Au), platinum (Pt), palladium (Pd), or nickel palladium (Ni—Pd). At Step S23, the step of forming the noble metal film may be performed using, for example, a gold cyanide plating bath (composition conditions: gold potassium cyanide (8 to 12 g/l), potassium cyanide (5 to 30 g/l), potassium hydrogen-phosphate (23 to 30 g/l), potassium carbonate (10 to 20 g/l), liquid temperature of 60 to 70° C., cathode current density of 0.1 to 1 A/dm$^2$) and a platinum plating bath (composition conditions: platinum (12 g/l), liquid temperature of 75 to 80° C., cathode current density of 0.1 to 1 A/dm$^2$).

In an embodiment of the invention, the thickness of the nickel film 51 may be 5 to 20 μm. In another embodiment, the thickness may be more limited to 5 to 10 μm. In an embodiment of the invention, the thickness of the noble-metal film 52 may be 0.5 to 2 μm, and the thickness of the resist 201 may be slightly greater than the overall thickness of the protective film 50 including the nickel film 51 and the noble-metal film 52.

After the step of forming the noble-metal film, e.g., Step S23, then at Step S24, the silicon wafer 200 having the resist 201 and the films 51 and 52 formed on the upper surface 200*a* may be immersed into a resist remover liquid to remove the resist 201, as shown in FIG. 8B. At the upper surface 200*a* of the silicon wafer 200, the portions where the resist 201 are formed may become holes and grooves, and the protective film 50, e.g., the stacked member including the nickel film 51 and the noble-metal film 52, may be completed. A through groove 50*a*, positioning holes 50*b*, 50*c*, 50*d*, and 50*e*, and filters 50*f* corresponding to the respective portions 201*a* to 201*f* of the resist 201 then may be formed in the protective film 50.

Figure 9C:
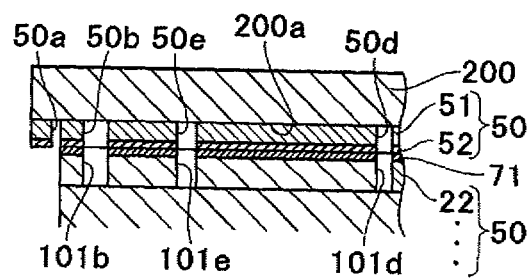
FIG. 9C is a partial sectional view along line C-C in FIG. 9A and showing a state in which the silicon wafer is placed on the upper surface of the flow-path unit through an adhesive.

Next, the protective film 50 manufactured by the Steps S21 to S24 may be secured to the upper surface of the flow-path unit 10*a* at Step S5. At this time, first, an adhesive 71, as shown in FIG. 9C, may be applied to the entire upper surface of the flow-path unit 10*a*. Then, referring to FIGS. 9A and 9B, the silicon wafer 200 may be placed on the flow-path unit 10*a* while the through groove 50*a* of the protective film 50 and the outer peripheral edges of the upper surface of the flow-path unit 10*a* are aligned with each other. At this time, the protective film 50 may be interposed between the upper surface 200*a* of the silicon wafer 200 and the upper surface of the flow-path unit 10*a*, and the positioning holes 50*b* to 50*e* of the protective film 50 and the respective positioning holes 101*b* to 101*e* of the flow-path unit 10*a* may be aligned with each other. Then, referring to FIG. 9C, the adhesive 71 may be hardened while pressing the stacked member including the silicon wafer 200 and the flow-path unit 10*a* using a jig. Here, it is possible for use a thermosetting adhesive as the adhesive 71, and to heat the adhesive 71 to a temperature greater than or equal to a hardening temperature of the adhesive 71 while the adhesive 71 is pressed.

In an embodiment of the invention, while the protective film 50 is being supported by the upper surface 200*a* of the silicon wafer 200, the protective film 50 may be secured to the upper surface of the flow-path unit 10*a*. At this time, the surface of the nickel film 51 at a side opposite to the silicon wafer 200 and the surface of the noble-metal film 52 at a side opposite to the nickel film 51 and the silicon wafer 200 may oppose the upper surface of the flow-path unit 10*a*. The area of the protective film 50 situated outwardly of the through groove 50*a* may be not secured to the flow-path unit 10*a*, whereas the area of the protective film 50 situated inwardly of the through groove 50*a* may be secured to the upper surface of the flow-path unit 10*a*. At the portion situated inwardly of the through groove 50*a*, the protective film 50 may be positioned to extend on both sides of the pressure chambers 33 and to cover the openings of the respective pressure chambers 33, as shown in FIG. 5A.

After the step of securing the protective film, e.g., Step S5, then, at Step S6, referring to FIG. 10A, the silicon wafer 200 may be removed from the protective film 50 secured to the upper surface of the flow-path unit 10*a*. At this time, the silicon wafer 200 may be removed while the area of the protective film 50 situated outwardly of the through groove 50*a*, e.g., as shown in FIG. 9C, is secured and supported by the upper surface 200*a*. The adhesive strength between the silicon wafer 200 and the nickel film 51 may be less than the adhesive strength between the nickel film 51 and the noble-metal film 52, the adhesive strength of the adhesive 71, and the adhesive strength between the plates 22 to 30 configuring the flow-path unit 10*a*. Accordingly, in an embodiment of the invention, the Step S6 may be easily performed by, for example, a manual operation.

Referring to FIG. 10B, the entire upper surface of the flow-path unit 10*a* excluding the positioning holes 101*b*, 101*c*, 101*d*, and 101*e* may be covered with the noble-metal film 52 and the nickel film 51, positioned in that order from a side closer to the upper surface of the flow-path unit 10*a*. Here, the surface of the nickel film 51 may be a surface that is placed upon the silicon wafer 200, and may be a smooth surface polished into a minor surface as with the upper surface 200*a* of the silicon wafer 200.

Figure 11:
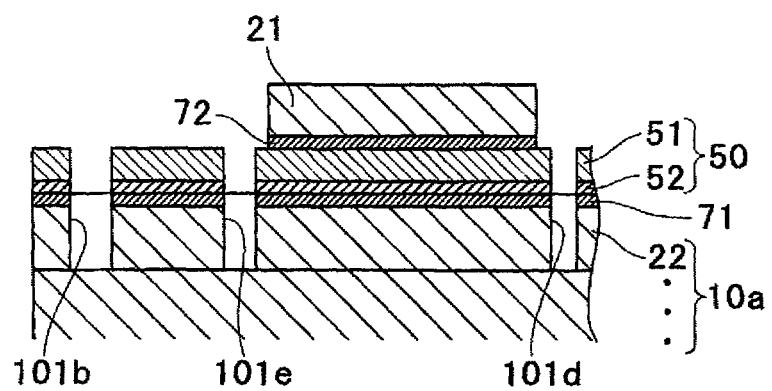
FIG. 11 is a partial sectional view corresponding to FIG. 10A and showing a state in the step of adhering an actuator unit.

After the Step S6 of removing the silicon wafer, then at Step S7, as shown in FIG. 11, in using an adhesive 72, the plurality of, e.g., eight, actuator units 21 manufactured in Step S3 may be adhered to the surface of the protective film 50 secured to the upper surface of the flow-path unit 10*a*, e.g., the surface of the nickel film 51 from which the silicon wafer 200 has been removed by carrying out the removing Step S6. At this time, the adhesive 72 may be previously applied to the back surface of each actuator unit 21 by a transfer method. The actuator units 21 may be adhered such that the individual electrodes 135 correspond to the pressure chambers 33 while the actuator units 21 extend on both sides of the pressure chambers 33 formed in areas corresponding to where the actuator units 21 are positioned.

Figure 5B:
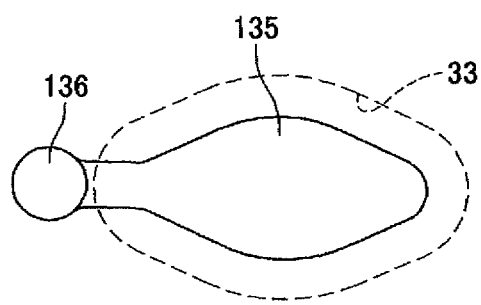
FIG. 5B is a plan view of an individual electrode according to an embodiment of the invention.

After the Step S7 of adhering the actuator units, for example, a conductive adhesive may be applied to individual lands 136, as shown in FIGS. 5A and 5B, and a common electrode land to join one end of each FPC 80, as shown in FIG. 1, to each of the actuator units 21. Then, the reservoir unit 10*b* manufactured in Step S4 may be adhered to the flow-path unit 10*a* with an adhesive at Step S8. At the upper surface of the flow-path unit 10*a*, not only the areas where the actuator units 21 are positioned, but also the portion to which the reservoir unit 10*b* is secured, also may be covered with the protective film 50. Therefore, the reservoir unit 10*b* may be secured to the upper surface of the flow-path unit 10*a* with the protective film 50 being positioned therebetween. The filters 50*f* may be formed at the portions of the protective film 50 to which the reservoir unit 10*b* is secured, such that ink from the reservoir unit 101*b* is supplied into the flow-path unit 10*a* through the filters 50*f*. In an embodiment of the invention, when the Steps S1 to S8 are performed, the head 10 may be completed.

As mentioned above, according to an embodiment of the invention, the protective film 50 may be positioned at the portions of the actuator units 21 that cover the openings of the pressure chambers 33, e.g., the portions of the piezoelectric sheet 43 shown in FIG. 5A opposing the pressure chambers 33. Therefore, ink in the pressure chambers 33 may not directly contact the actuator units 21, e.g., the piezoelectric sheet 43 shown in FIG. 5A. Consequently, even if the actuator units 21 are damaged to such an extent as to allow ink in the pressure chambers 33 to penetrate the actuator units 21, the penetration of the ink may be prevented by the protective film 50, such that it is possible to prevent an electrical short circuit from occurring.

Further, in an embodiment of the invention, it is possible for the protective film 50 to be thinly formed, for example, without any wrinkles, without being displaced, and without entry of air bubbles by using the method in which the entire silicon wafer 200 is formed on the flow-path unit 10*a* after previously forming the protective film 50 on the silicon wafer 200, and the protective film 50 is transferred from the silicon wafer 200 to the flow-path unit 10a, instead of by using the method of directly forming the protective film 50 on the flow-path unit 10a.

In the step of removing the silicon wafer at Step S6, the surface of the protective film 50 from which the silicon wafer 200 is removed, e.g., the surface of the nickel film 51 shown in FIG. 10A at a side opposite to the noble-metal film 52, may be a smooth surface as with the upper surface 200a of the silicon wafer 200. In the step of adhering the actuator units at Step S7) the surface of the protective film 50 from which the silicon wafer 200 is removed may be a surface to which the actuator units 21 are adhered. Therefore, it is possible to make the surface of the protective film 50 to which the actuator units 21 are adhered very smooth. Moreover, because the adhesive 72 can be uniformly applied when, for example, it is applied to the smooth surface of the nickel film 51 shown in FIG. 11, the flow-path unit 10a and the actuator units 21 properly may be adhered to each other.

Moreover, because the surface of the protective film 50 to which the actuator units 21 are adhered, e.g., the surface of the nickel film 51 at a side opposite to the noble-metal film 52, is a smooth surface, in an embodiment of the invention it is possible to prevent the formation of cracks in the actuator units 21 resulting from, for example, the application of pressure in the step of adhering the actuator units at Step S7. If the surface of the protective film 50 to which the actuator units 21 are adhered has a recessed portion and a protruding portion, cracks may be prevented from forming when, for example, force generated during a pressing operation becomes nonuniform, or the pressing operation is performed in a state in which foreign matter enters the recessed portion. Further, in an embodiment of the invention, the protective film 50, interposed between the flow-path unit 10a and the actuator units 21, is thin and smooth. Thus, the driving of the actuator units 21 may be stabilized, that is, discharge performance is stabilized.

The protective film 50 may be a stacked member including the nickel film 51 and the noble-metal film 52. Although the corrosion resistance of the nickel film 51 with respect to ink is low, the corrosion resistance of the protective film 50 as a whole may be increased by interposing the noble-metal film 52 having a relatively high corrosion resistance between the upper surface of the flow-path unit 10a and the nickel film 51. Thus, an electrical short circuit of the actuator units 21 may be reliably prevented from occurring.

It is possible to increase corrosion resistance while restricting an increase in production costs, by interposing the noble-metal film 52 formed of at least one noble metal and being thinner than the nickel film 51 between the upper surface of the flow-path unit 10a and the nickel film 51. In addition, in an embodiment, the adhesive strength between these films 51 and 52 may be stabilized by combining the nickel film 51, which may have a relatively low corrosion resistance and being low in cost, and the noble-metal film 52, which may have a relatively high corrosion resistance and being expensive, with each other.

In the step of manufacturing the protective film, e.g., Step S2, and described in more detail in Steps S21 to S24, when the filters 50f, which cover the openings 105b formed in the upper surface of the flow-path unit 10a, are positioned at the protective layer 50, the steps may be simplified, and production costs may be reduced compared to when a single filter is positioned and secured to the flow-path unit 10a in a different step.

In the step of manufacturing the protective film, e.g., Step S2, and described in more detail in Steps S21 to S24, the positioning holes 50d, e.g., two each being provided along the oblique sides connecting the upper bases and the lower bases of the respective trapezoidal actuator unit 21, may be formed in the protective film 50. In the step of securing the protective film, e.g., Step S5, the protective film 50 may be secured to the upper surface of the flow-path unit 10a while the positioning holes 101d, which may be positioned at the areas where the actuator units 21 are positioned at the upper surface of the flow-path unit 10a, and the positioning holes 50d of the protective film 50 may correspond to each other. Thus, in an embodiment of the invention, it is possible to efficiently and precisely position the protective film 50 with respect to the flow-path unit 10a. After the step of securing the protective film at Step S5, it may be easily examined, for example, whether or not any wrinkles are formed in the protective film 50 or whether the protective film 50 has been displaced, by confirming the positions of the positioning holes 50d formed in the protective film 50. Further, even in the step of adhering the actuator units at Step S7, the actuator units 21 may be efficiently and precisely positioned with respect to the flow-path unit 10a by using the positioning holes 50d formed in the protective film 50, in a similar manner to as described above.

The areas of the protective film 50 formed on the silicon wafer 200 at the outer peripheral edges may tend to be thicker than the inner areas. Therefore, referring to FIGS. 9A to 9C, after forming the through groove 50a in the protective film 50, in the step of removing the silicon wafer at Step S6, the area that is situated outwardly of the through groove 50a, e.g., the portion that tends to be thicker, supported by the silicon wafer 200 may be separated from the flow-path unit 10a along with the silicon wafer 200. By this, since the portion of the protective film 50 secured to the upper surface of the flow-path unit 10a is a portion that is situated inwardly of the through groove 50a, a thin film having a relatively uniform thickness may be positioned on the upper surface of the flow-path unit 10a.

In the step of forming the nickel film at Step S22 by using the nickel electroforming method, it may become easy to adjust the thickness of the nickel film 51, such that the relatively thin nickel film 51 can be easily formed. By using the silicon wafer 200 when manufacturing the protective film 50, it is not necessary to perform special operations, such as forming a smooth surface. In the step of adhering the actuator units at Step S7, by previously applying the adhesive 72, e.g., used for adhering the nickel film 51 and the actuator units 21 to each other, to the actuator units 21 by the transfer method, it is possible to more reliably uniformly apply the adhesive 72.

The plurality of, e.g., eight, actuator units 21 may be positioned along a long area in one direction at the upper surface of the flow-path unit 10a. The protective film 50 may be positioned using a long pattern corresponding to the areas where the plurality of, e.g., eight, actuator units 21 are positioned at the upper surface of the flow-path unit 10a. When the protective film 50 is positioned using such a long pattern, it may tend to be difficult to form the protective film 50 in a thin layer without, for example, any wrinkles. Nevertheless, the method set forth according to an embodiment of the invention allows thinly forming the protective film 50 without, for example, any wrinkles. In addition, the thin protective film 50 may have high handleability and usability.

Although embodiments of the present invention are described, the present invention is not limited thereto. Various design changes may be made as long as they are within the scope of the claims. For example, in another embodiment of the invention, the particular film is not limited to that formed of nickel. As long as the first film is impervious, e.g., impermeable, to the liquid used, the film may be formed of any other material, e.g., Cu, or resin. Moreover, in an embodiment of the invention, the method of forming the first film may be a method other than the nickel electroforming method, e.g., any suitable method for forming a film.

The further film is not limited to that formed of a noble metal. Any material which has higher resistance to corrosion with respect to a liquid than the first film may be used to form the second film, including materials other than noble metals. In addition, in another embodiment of the invention, the second film may be omitted. Moreover, in another embodiment of the invention, the first and second films may be set to any thicknesses.

In an embodiment of the invention, the formation patterns on the flow-path unit of the first and second films only include areas corresponding to the openings of the pressure chambers at the surface of the flow-path unit. Accordingly, in this embodiment, the protective film 50 need not be positioned along the entire area of the flow-path unit excluding the positioning holes 101b, 101c, 101d, and 101e. For example, the first and second films need not be formed along the entire actuator-unit disposition areas at the surface of the flow-path unit, that is, they need not be formed at portions, e.g., end portions of the disposition areas not opposing the openings of the pressure chambers. In addition, the method of forming the first and second films is not limited to that using long patterns corresponding to the areas where the actuator units 21 are positioned.

In the above-described embodiment, in the step of securing the protective film at Step S5, the adhesive 71 is applied to the upper surface of the flow-path unit 10a, an adhesive may be applied to the protective film 50. In another embodiment, e.g., when the protective film 50 itself has adhesive property, an adhesive need not be interposed. In the above-described embodiment, in the step of adhering the actuator units at Step S7, the adhesive 72 is applied to the actuator unit 21 by the transfer method. Nevertheless, the adhesive 72 may be applied using various other methods. Alternatively, the adhesive 72 may be applied to the protective film 50 instead of to the actuator units 21.

Moreover, in an embodiment of the invention, the filters 50f may not be formed at the protective film 50. Further, the positioning holes 50d may not be formed in the protective film 50. In an embodiment of the invention, it is not necessary for the protective film 50 to be formed along an area that is larger than the upper surface of the flow-path unit 10a and for only areas of the protective film 50 situated inwardly of the through groove 50a to be secured to the upper surface of the flow-path unit 10a. The supporting member may have a smooth surface, and may have any other characteristics not listed here, for example, the characteristics of the supporting member are not limited to the supporting member being a plate-like member, conductive, or rigid. Various materials other than the silicon wafer 200 also may be used for the supporting member.

The number of actuator units is not limited to a plural number of actuator units, and their planar shape is not limited to a trapezoidal shape. Moreover, the liquid discharge head may discharge a liquid other than ink in another embodiment. Additionally, the invention also is applicable to other types of print heads, e.g., a serial head, and other types of devices in general. The liquid discharge head manufactured by the manufacturing method according to embodiments of the invention may be applicable to various devices, such as a printer, a facsimile machine, or a copying machine.

While the invention has been described in connection with various exemplary structures and illustrative embodiments, it will be understood by those skilled in the art that other variations and modifications of the structures and embodiments described above may be made without departing from the scope of the invention. Other structures and embodiments will be apparent to those skilled in the art from a consideration of the specification or practice of the invention disclosed herein. It is intended that the specification and the described examples are illustrative with the true scope of the invention being defined by the following claims.

What is claimed is:

1. A method of manufacturing a liquid discharge head, wherein the liquid discharge head comprises a flow-path unit and a piezoelectric actuator unit, the flow-path unit comprising a liquid flow path comprising a plurality of discharge openings and a plurality of pressure chambers which open at a surface of the flow-path unit and correspond to the plurality of discharge openings, the actuator unit comprising a plurality of actuators which apply pressure to liquid in the pressure chambers, the method comprising steps of:

positioning the actuator unit to oppose the surface of the flow-path unit while extending on the plurality of pressure chambers;

forming a particular film on a surface of a supporting member that supports the particular film such that a pattern which includes areas of the surface of the flow-path unit corresponding to openings of the plurality of pressure chambers is formed, wherein the particular film is impermeable relative to the liquid; and securing the particular film to the surface of the flow-path unit, the securing step comprising the steps of:

placing the supporting member having the particular film formed thereon on the flow-path unit; and aligning the supporting member such that a surface of the particular film on a side opposite to the supporting member opposes the surface of the flow-path unit while the openings of the plurality of pressure chambers are covered.

2. The method of manufacturing the liquid discharge head according to claim 1, further comprising a step of:

separating the supporting member from the particular film secured to the surface of the flow-path unit after the step of securing the particular film.

3. The method of manufacturing the liquid discharge head according to claim 2, further comprising a step of:

adhering the actuator unit to a surface of the particular film from which the supporting member was removed during the separating step, such that the actuator unit extends on the plurality of pressure chambers and each of the actuators corresponds to the respective pressure chambers.

4. The method of manufacturing the liquid discharge head according to claim 3, further comprising a step of:

forming a further film, which is more resistant to corrosion from the liquid than the particular film, on the surface of the particular film at the side opposite to the supporting member, such that the further film is interposed between the surface of the flow-path unit and the particular film, wherein the step of forming a further film is performed subsequent to the step of forming the particular film and prior to the step of securing the particular film.

5. The method of manufacturing the liquid discharge head according to claim 4, wherein the further film comprises a noble metal, and has a thickness that is less than a thickness of the particular film.

6. The method of manufacturing the liquid discharge head according to claim 2, wherein the step of forming the particular film comprises:

forming the particular film along an area that is larger than the surface of the flow-path unit; and forming a through groove corresponding to an outer peripheral edge of the surface of the flow-path unit in the particular film, wherein the through groove of the particular film and the outer peripheral edge of the surface of the flow-path unit are aligned with each other.

7. The method of manufacturing the liquid discharge head according to claim 6, wherein the step of securing the particular film comprises:
securing an area of the particular film situated inwardly of the through groove to the surface of the flow-path unit.

8. The method of manufacturing the liquid discharge head according to claim 7, wherein the step of separating the supporting member comprises:
separating the supporting member while an area of the particular film situated outwardly of the through groove is supported by the supporting member.

9. The method of manufacturing the liquid discharge head according to claim 3, wherein the step of adhering the actuator unit comprises:
applying an adhesive to one of the particular film and the actuator unit using a transfer method; and
adhering the particular film and the actuator unit to each other using the adhesive.

10. The method of manufacturing the liquid discharge head according to claim 4, wherein the step of forming the further film comprises the step of:
forming the further film to a thickness from 0.5 to 2 μm.

11. The method of manufacturing the liquid discharge head according to claim 1, wherein the step of forming the particular film further comprises the step of:
forming a filter, which covers openings formed in the surface of the flow-path unit to introduce the liquid into the liquid flow path, at the particular film.

12. The method of manufacturing the liquid discharge head according to claim 1, wherein the step of forming the particular film comprises a step of:
forming a plurality of positioning holes in the particular film, along respective oblique sides connecting an upper base and a lower base of the trapezoidal actuator unit, and wherein the method of manufacturing the liquid discharge head further comprises:
forming positioning marks of actuator disposition areas at the surface of the flow-path unit while securing the particular film to the surface of the flow path unit, wherein the positioning parks are made to correspond to the positioning holes.

13. The method of manufacturing the liquid discharge head according to claim 1, wherein the step of forming the particular film comprises:
forming the particular film using a nickel electroforming method.

14. The method of manufacturing the liquid discharge head according to claim 1, wherein the supporting member comprises a silicon wafer.

15. The method of manufacturing the liquid discharge head according to claim 1, wherein a plurality of the actuator units are positioned along a long area in one direction at the surface of the flow-path unit, and wherein the step of forming the particular film comprises:
forming a long pattern in the particular film which corresponds to disposition areas of the plurality of the actuator units at the surface of the flow-path unit.

16. The method of manufacturing the liquid discharge head according to claim 1, wherein the step of forming the particular film comprises the step of:
forming the particular film to a thickness from 5 to 20 μm.

17. The method of manufacturing the liquid discharge head according to claim 1, wherein the surface of the supporting member is a smooth surface.

* * * * *